(12) United States Patent
Lüdemann

(10) Patent No.: US 6,559,479 B1
(45) Date of Patent: May 6, 2003

(54) THIN-FILM SOLAR ARRAY SYSTEM AND METHOD FOR PRODUCING THE SAME

(75) Inventor: Ralf Lüdemann, Freiburg (DE)

(73) Assignee: Fraunhofer-Gesellscahft zur Forderung der angewandten Forschung e.V., Munich (DE)

(*) Notice: Subject to any disclaimer, the term of this patent is extended or adjusted under 35 U.S.C. 154(b) by 0 days.

(21) Appl. No.: 09/856,678
(22) PCT Filed: Nov. 23, 1999
(86) PCT No.: PCT/EP99/09049
§ 371 (c)(1), (2), (4) Date: May 24, 2001
(87) PCT Pub. No.: WO00/35024
PCT Pub. Date: Jun. 15, 2000

(30) Foreign Application Priority Data

Nov. 25, 1998 (DE) .......................................... 198 54 269

(51) Int. Cl.$^7$ .......................... H01L 29/22; H01L 31/06
(52) U.S. Cl. .......................... 257/99; 136/255; 136/256
(58) Field of Search ................................. 136/244, 255, 136/256; 257/24

(56) References Cited

U.S. PATENT DOCUMENTS 5,009,720 A * 4/1991 Hokuyo et al. ............. 136/255
5,223,044 A * 6/1993 Asai ........................... 136/255

* cited by examiner

Primary Examiner—David Nelms
Assistant Examiner—Reneé R. Berry
(74) Attorney, Agent, or Firm—Antoneli, Terry, Stout & Kraus, LLP

(57) ABSTRACT

Disclosed is a thin-layer solar cell array system and a method for producing the same, having placed over a carrier substrate of plane design, a solar cell layer which is provided with at least one n-type conducting semiconductor zone (emitter) and at least one p-type conducting semiconductor zone (base) as well as a first and a second contact electrode, each of different electric polarity, which are each electrically connected to the emitter respectively to the base.

The invention is distinguished by at least the first contact electrode being applied directly on the carrier substrate or separated by an electrically insulating layer, an electrically insulating layer being provided thereupon, and the solar cell layer being placed over the insulating layer, by at least one contact channel extending through the insulating layer and/or the solar cell layer in such a manner that the first contact electrode and the semiconductor layer zone of respective polarity inside the solar cell layer being electrically connectable by means of an electrically conducting material provided inside the contact channel, and by the second contact electrode like the first contact electrode being placed above or in the case of a conductive carrier layer also under the carrier layer and under the electrically insulating layer and the solar cell layer, and by at least one contact channel extending through the insulating layer and/or the solar cell layer in such a manner that the second contact electrode and the semiconductor layer zone of respective polarity inside the solar cell layer being electrically connected by means of an electrically conducting material provided inside the contact channel.

22 Claims, 4 Drawing Sheets

THIN-FILM SOLAR ARRAY SYSTEM AND METHOD FOR PRODUCING THE SAME

BACKGROUND OF THE INVENTION

1. Field of the Invention

The present invention relates to a thin-film solar cell array system and a method for producing the same.

2. Description of the Prior Art

Solar cells are components which convert light into electric energy. Usually they comprise a semiconductor material containing n-type and p-type zones, i.e. zones in which current is transported by means of respectively negative and positive charge carriers. These zones are referred to respectively as the emitter and the base. The positive and negative charge carriers generated by incident light are separated and can be conveyed by means of metallic contacts on the respective zones. Only those charge carriers contribute to useable electric power that reach the contacts and do not recombine with a charge carrier of reverse polarity. A further loss mechanism is the reflection of light at the metal contacts, referred to as contact shading the solar cell. The smaller the shading, i.e. the more light which is able to reach the solar cell, the greater the current exploitation by the cell per area and therefore the greater the efficiency. The contacts on the light-facing side, usually the front surface of the cells, are usually designed as comb-shaped structures, so-called grids. However, in order to ensure current conveyance with little resistance, the spacing of the grid fingers must not be selected too large and the number and cross section must not be selected to be too small. A certain amount of shading must be taken into account in conventional solar cells.

With the development of cheaper starting materials, the concept of thin-film solar cells on cost-favorable substrates is gaining more significance. One such known solar cell (see FIG. 1a) comprises only one active solar cell layer 1 comprising a p-type doped base zone 1b and, in the depicted instance of FIG. 1a, n-typed doped selective emitter zones 1a. The active solar cell layer 1 applied to a carrier substrate 2 usually possesses a thickness of approximately 3–50 mm. However, many such substrates 2 are not conductive. Therefore, the electrical contact to base 1b cannot occur from the back surface via the carrier substrate 2. Instead a so-called single-side grid comprising two intermeshing grids, an emitter grid 3a and a base grid 3b, for contacting the emitter 1a and the base 1b respectively must be employed.

Such a solar cell array system can be simultaneously used for connecting multiple solar cells on a carrier substrate as described in DE 197 15 138.

U.S. Pat. No. 4,490,573 describes a solar cell. See in particular the embodiment of FIG. 8, which is provided with a contact layer 51 applied onto a glass substrate 52 and is electrically connected via contacting zones with, for example the n-type doped zone of a solar cell layer 54. Solar-cell layer 54 is produced by means of gradual doping using the doping atoms arsenic and bromide. This is essentially illustrated in FIG. 9 and the respective description. Contact electrodes 16 are placed directly on the p-typed doped layer of the solar cell layer. Therefore, the electrode structures are provided on both sides of the solar cell layer and shade the solar cell layer at least partially from unimpeded irradiation.

The solar cell described in WO89/04062, providing a multilayered solar cell array system, has the same drawback. See in particular the embodiments of FIGS. 1a and b. FIG. 1b essentially shows a first electrode 14 placed directly on a glass substrate on which the silicon-based solar cell layer is applied. A second electrode layer, which is interrupted by dielectric zones 20, is in direct contact with solar cell layer 16. A gridlike electrode structure 32, which is connected to the solar cell layer 16 and to the first electrode layer 14 via the electrically conducting connecting channels 22, is placed on the dielectric layer 20.

FIG. 1b shows a similar known arrangement for a back-contact cell, a concept for highly efficient solar cells. In this case, both contacts 3a and 3b are placed on the back surface of the solar cells to completely eliminate shading on the front surface. If the contacts are realized as narrow grids, light that reaches from the back surface through to the front surface can also contribute to generating electricity (so-called bifacial cell).

Hitherto realization of this single-side grid has only been possible by means of very complicated processes. The selective emitter is created by multiple masking steps: the emitter does not comprise a homogeneous lateral layer but rather comprises a subzone corresponding to the shape of the emitter grid. In this manner, base zones are retained on the surface and can be directly contacted. Placing the respective metal contacts precisely on the corresponding zones poses a critical alignment problem and also requires masks, which must be accurately aligned.

Such a type back-contact cell is described in JP 2-51282 and is known as emitter wrap through (EWT). However, an EWT cell is limited to solar cells made of silicon disks respectively wafers. But the essential cost-saving potential in photo-voltaic cells lies in reducing the use of the expensive silicon to only a few-micrometer-thick layer, so-called thin-layer solar cells. As a carrier substrate is a prerequisite for these thin-layer solar cells, their back surface is not accessible and the known EWT process cannot be applied. At the same time, due to this minimal thickness, thin-layer cells permit using silicon of poorer quality than for conventional or EWT solar cells.

SUMMARY OF THE INVENTION

The present invention provides a thin-layer solar cell array system having, placed over a carrier substrate of plane design, a solar cell layer having at least one n-type conducting semiconductor layer zone (emitter) and at least one p-type conducting (base) semiconductor layer zone as well as a first and a second contact electrodes each of different electrical polarity, which are each electrically connected respectively to the emitter and the base in such a way that a solar cell can be produced in a simpler and less expensive manner without impairing the efficiency of the solar cell. Contrary to the state of the art, the electrical contact of the individual semiconductor zones occurs without using masks which require highly accurate alignment and is realizable using simpler methods. Furthermore, the thin-layer solar cell array of the invention permits simple interconnection of multiple solar structures on a carrier substrate as well as allowing provision of a protective diode. In particular, the thin-layer solar cell array system provides the connecting electrodes only on one side of the solar cell layer to, in this manner, have as few as possible shading losses due to the electrode structures. Finally, the invention is a method for producing the novel thin-layer solar cell array system.

The thin-layer solar cell array system of the invention places over a carrier substrate of plane design, a solar cell layer with at least one n-type conducting semiconductor zone, the emitter zone, and at least one p-type conducting semiconductor zone, the base zone, as well as a first and a second contact electrode each of different electrical polarity, which are each respectively electrically connected to the emitter and to the base. The thin layer solar cell is designed in such a manner that the first and the second contact electrodes are applied directly or separated by an electrically insulating layer on the carrier substrate over which an electrically insulating layer is provided with the solar cell layer placed over this insulating layer. The contact electrodes are preferably designed as grid-shaped strip conductors and are made of metal or other highly conductive materials. The two contact electrodes, which are electrically connectable to different polarities, are placed spaced apart on the carrier substrate.

For electrical contacting of the respective semiconductor layer zones (emitter zone, base zone) produced on top of each other with the corresponding contact electrodes, first contact channels and second contact channels are provided which extend through the insulting layer and/or through the active solar cell layer down to the contact electrodes.

Production can occur during deposition of the silicon layer but also by means of transformation respectively by means of diffusion. Preferably multiple first and second contact channels are provided into which electrically conductive material is introduced by means of which the first contact electrodes are electrically connected with the semiconductor zone corresponding to its polarity. Furthermore, the second contact electrode is electrically connected with the semiconductor zone corresponding to the polarity thereof via second contact channels.

The contact channels are designed as one-sided blind holes bordered by the respective contact electrodes and serve to electrically contact the individual semiconductor layer zones without the contacting measures substantially influencing the active solar cell surface. Of the solar cell layer, only the cross sections of the individual contact channels are lost, which however is a relatively small part of the surface.

With the contacting and the layered arrangement of the thin-layer solar cell of the invention, the solar cell can be divided into lateral sections as desired in that the layers can be separated down to the insulating layer covering the contact electrodes. Such subdivision permits combining several solar cells applied to a single carrier substrate. This is not possible, for example, with the previously mentioned EWT solar cells. Furthermore, protective diodes, which are placed on the same carrier substrate as the solar cells, are provided to bridge the solar cells in the event of malfunction and in this way increase secure operation and the lifetime of the solar cells.

Further embodiments of arranging the thin-layer solar cell array system and the method for producing the same are explained in more detail with reference to the drawings.

BRIEF DESCRIPTION OF THE DRAWINGS

The present invention is made more apparent in the following using preferred embodiments with reference to the accompanying drawings without the intention of limiting the scope or spirit of the invention.

DESCRIPTION OF PREFERRED EMBODIMENTS

Figure 1:
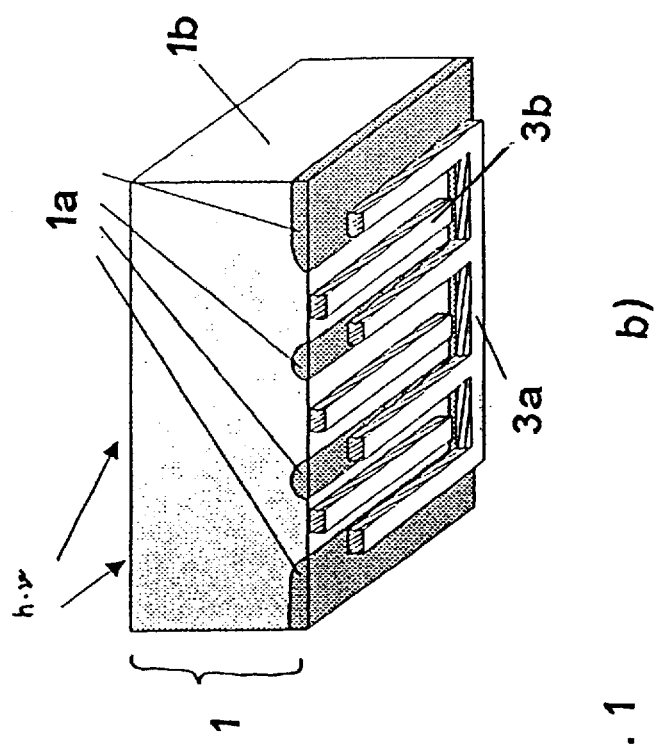
FIGS. 1a and b illustrate a state-of-the-art single-side contacted solar cell array system.
Figure 1:
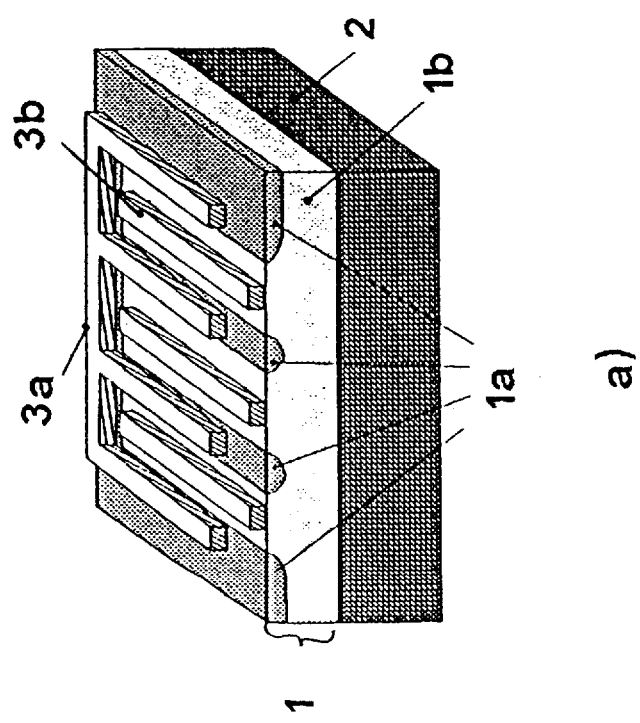
Figure 2:
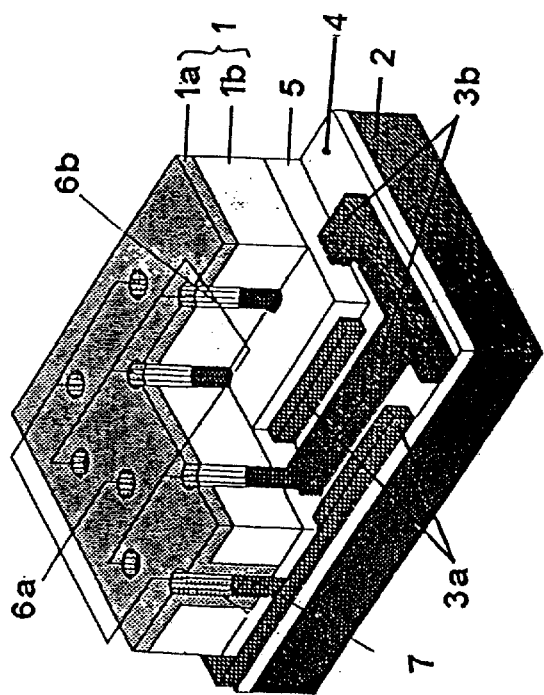
FIG. 2 illustrates the principle setup of a back-contacted thin-layer solar cell designed according to the present invention.

FIG. 2 shows the principle setup of the invented back-contact thin-layer solar cell (BC-TFC, Engl. Back-contact thin-layer) of the present invention.

Before deposition of the active solar cell layer 1, strip conductors 3a and 3b made of metal or other conductive materials, such as e.g. silicides (e.g. $TiSi_2$) are directly applied to a carrier substrate 2 or to lower insulation layer 4. These strip conductors are covered with an upper electrical insulation layer 5 (for example, made of nitrides and/or oxides and/or carbides). In addition to electric insulation, the purpose of this layer 5 is to encapsulate the metal of the contact electrodes 3a and 3b, because it can melt in the subsequent temperature steps (e.g. during deposition of the active semiconductor layer or during formation of an emitter). Encapsulation ensures that the metal neither runs nor that large amounts of the metal diffuse through the insulation layer and adversely effect the quality of the active layer in this manner.

If connection to a protective diode or multiple cells is to be possible, in this event the contact electrode 3b must also be placed insulated on the substrate. For this purpose, the carrier substrate 2 is designed as being conductive or porous. In the case of such a type of conductive substrate, the contact electrode 3b is also placed on the back surface of the carrier substrate in such a manner that the contact can occur via the substrate, which still corresponds to contacting with two contacts on the side of the solar cell facing away from light; so to say a special case.

In the following, the contact electrodes 3a and 3b represent the electrical contacting of the solar cell. Corresponding to the electric polarity in the external circuit, they can be divided into positive (plus-) 3b contact electrodes and negative (minus-) 3a contact electrodes. In general, the positive contact electrodes and the negative contact electrodes alternate. However, other arrangements are possible (e.g. a positive contact strip conductor followed by two negative-contact strip conductors and then again by a positive-contact strip conductor).

The active semi-conductor layer 1 is deposited on the encapsulated contact electrodes 3a and 3b. Various semiconductor technology processes are available for this purpose, e.g. deposition from the liquid phase (LPE) or from the gas phase (CVD) or plasma-supported deposition (PECVD), etc. It can be useful to first deposit a thin seed layer whose quality is improved by means of a recrystallization process before the actual solar cell layer is epitaxially deposited on it. Expediently, this layer is already p-type conducting and represents the base 1b in the solar cell. Subsequently, the emitter 1a is either formed by means of depositing the n-type conducting material or by means of diffusing doping materials into the surface of the semiconductor layer to a typical depth of 0.31–1 mm.

Contacting the solar cell, i.e. the electrical connection of emitter 1a and base 1b with the corresponding contact electrodes, i.e. negative-contact strip conductors 3a for contacting the emitter, positive-contact strip conductors 3b for contacting the base occurs by means of the contact holes 6a and 6b designed as blind holes, preferably produced perpendicular above the respective contact electrodes through the active semiconductor layer 1. The distance and the size of the contact channels 6a and 6b have to be optimized in such a manner ensuring, on the one hand, good conductance of the charge carrier from the solar cell into the strip conductor and, on the other hand, least possible loss of the solar cell material.

Realization of electric contacting occurs by means of the following steps:

Prior to formation of the emitter, i.e. producing the top semiconductor layer zone 1a, the blind holes 6a to be used for contacting the emitter are created through the active layer 1 to the insulation layer 5. (See FIG. 3a.) The location of the blind holes 6a is selected in such a manner that they are situated above the negative-contact electrodes 3a. The blind holes 6a may be etched, produced by laser or produced by means of high-pressure particle radiation. Sawing small slits or crosses is also possible.

Subsequently formation of the emitter, in which the entire free surface of the semiconductor layer 1a, thus also the flanks of the blind holes 6a, are fully coated with a fully coated emitter layer 1a (FIG. 3b) formed by means of diffusion.

Figure 3:
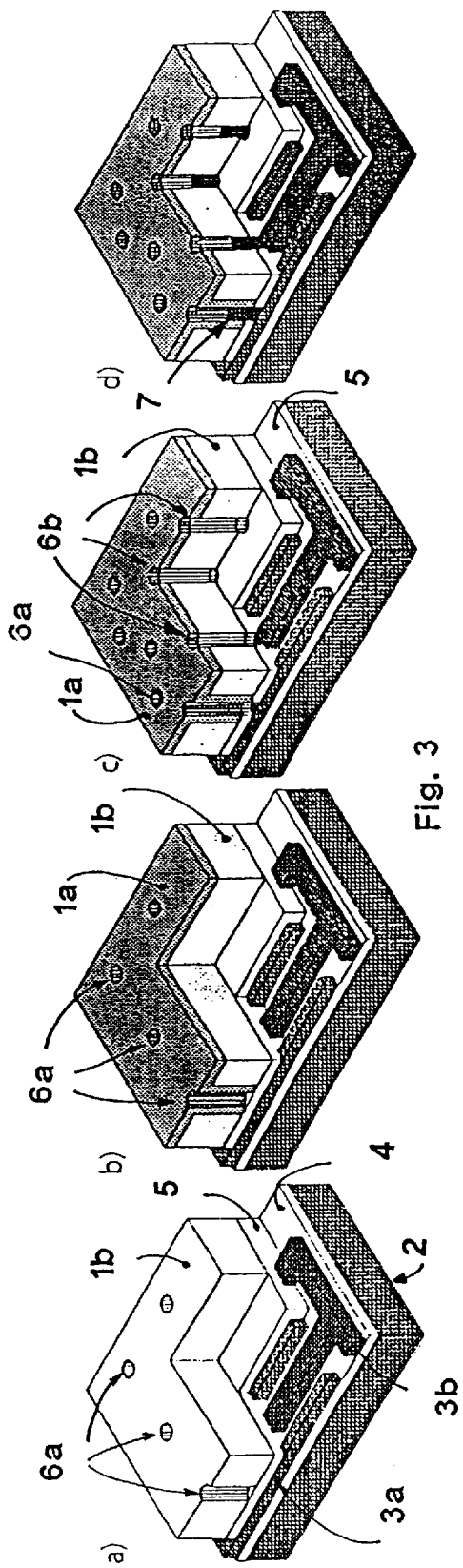
FIGS. 3a–d illustrate steps for producing emitter-base contacting of the back surface thin-layer solar cell, FIGS. 4a, b and c illustrate cross sections of various thin-layer solar cells.

Following formation of the emitter, the bottom of the emitter contact channels 6a is driven through the insulation layer 5 until the blind holes 6a meet the metallic negative-contact electrodes 3a (FIG. 3c).

Also following formation of the emitter, above the positive-contact electrodes 3b, the blind holes 6b are produced through the layer sequence 1a and 1a to the positive-contact electrodes. The electrical contact to the base layer 1b is to be produced through these blind holes 6b (FIG. 3c).

Electrical contacting, i.e. connecting the emitter 1a and base 1b and the corresponding contact electrodes 3a and 3b (FIG. 3d) occurs by means of introducing an electrically conducting material 7, preferably metal, in the blind holes 6a, 6b.

Figure 4:
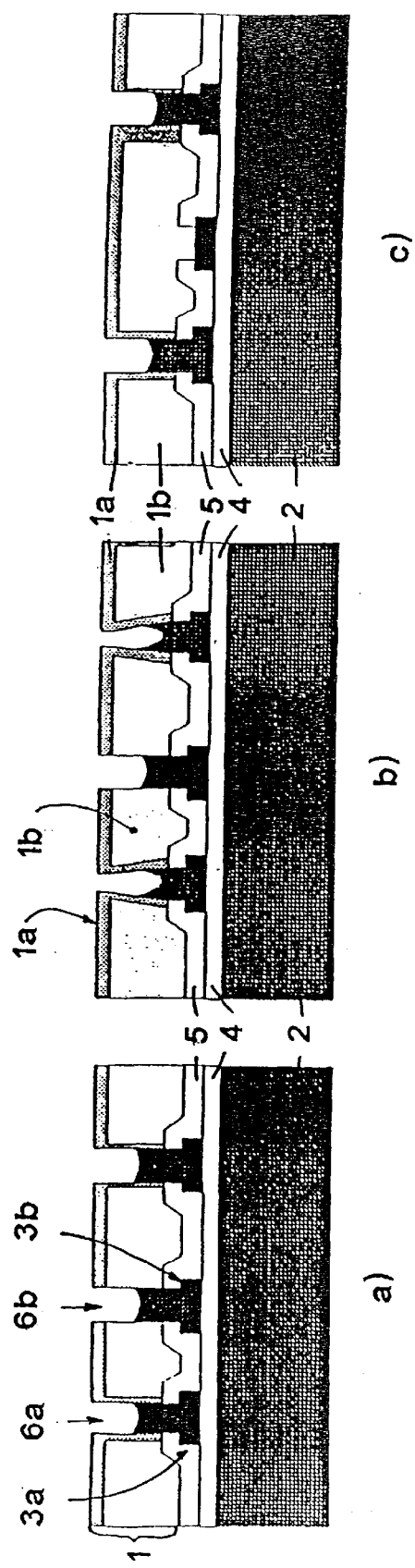

Usually, metal 7 is applied by means of vapor deposition and, if necessary, subsequently reinforced by means of electroplating. Metal pastes can also be squeegueed in. Therefore, it is advantageous that the vapor deposited metal 7 not only covers the bottoms but also the flanks in the lower zone of the holes 6a and 6b and in this way establishes contact between the respective semiconductor layer zones 1a and 1b and the contact electrodes 3a and 3b via the insulation layer 5. To ensure this, it has proved to be advantageous to taper the blind holes downward as is explained herein with reference to FIG. 4.

However, suitable selection of contact electrode materials (e.g. silver or a mixture of aluminum and silver) can obviate vapor deposition. In an electroplating process, metal (e.g. silver) can be directly grown on the bared contact electrode sites in the blind holes 6a and 6b.

The bared metals of the contact electrodes on the bottom of the blind holes can also be utilized as the vapor deposition source. Strong heating above the melting point partially evaporates or spatters the metal of the contact electrodes and precipitates on the flanks of the blind holes.

FIGS. 4a, b and c show in detail a diagrammatic view of the contact scheme, the cross sections depict a finished contacted thin-layer solar cell. Alternating contact electrodes 3a and 3b for negative and positive contacts are located on the carrier substrate 2 with the optional insulation layer 4. Contact electrodes 3a and 3b are insulated from the active solar cell layer 1 by insulation layer 5. Located in the solar cell layer 1 above the contact electrodes 3a and 3b are blind holes 6a and 6b. As the blind holes 6a over the negative-contact electrode 3a were produced before forming the emitter, their flanks are coated with a fully coated emitter layer 1a. Consequently, the metal 7 applied into the blind holes leads to electrically connecting the emitter layer 1a with the negative-contact electrode 3a. On the other hand, the blind holes 6b above the positive-contact electrode 3b are not produced until after formation of the emitter (through the emitter layer at the surface). Metal 7 connects the base 1b with the positive-contact electrode 3b.

However, the emitter contact channels 6a can also be produced during production of the active solar cell layer 1. First, a thin layer 1b is deposited, and the holes provided for contacting the emitter are produced in this layer in the aforedescribed manner. Prior thereto, the layer 1b can also be remelted or recrystallized in another manner to improve their crystallographic quality. Subsequently, preferably epitaxial deposition of the remaining solar cell layers 1b and 1a occurs. There is no growth in the blind holes. However, the holes and the deposition process must be selected in such a manner that the holes are not clogged by growth or grown over from the edge. Holes that strongly taper upward must be avoided, because this would prevent metallization by vapor deposition. However, as described over, the metal of the contact electrodes can be utilized as a source of vapor deposition in such a manner that upward tapering contact holes can even be very advantageous as shown in FIG. 4b.

The advantages of the formation of the emitter contact holes after a first deposition as previously described are the small to-be-produced depth of the blind holes, the large diameter of the to-be-produced holes—as the holes will become narrower again in the subsequent deposition due to growth at the flanks of the holes—and the prevention of damage to the material at the flanks of the holes, as can always occur in producing blind holes. The two first factors reduce production costs enormously due to shorter process times and coarser masking.

Principally, base 1b of the solar cell can also be contacted in another manner. The precondition is that deposition of at least the first layers of the active layer 1b (approximately a few nanometers) is at temperatures below the melting temperature of the employed contact strip material. For this purpose, before deposition, the isolation layer 5 is removed or not even applied in the first place at the locations on the corresponding contact electrodes 3b, that should have contact to base 1b. (See FIG. 4.) This process even yields by means of the following high-temperature steps a highly doped zone, a so-called back surface field, above the contact, which effects the solar cell positively.

Figure 5:
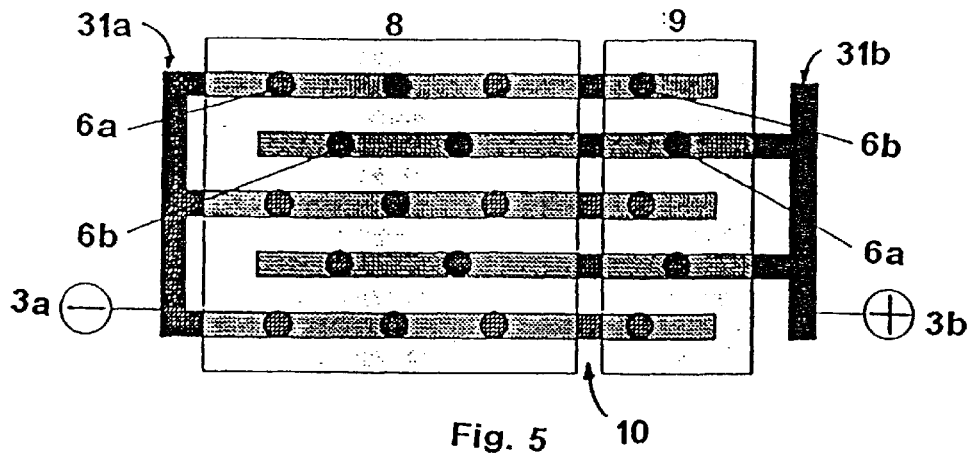
FIG. 5 illustrates a thin-layer solar cell array system having a protective diode.

The thin-layer solar cell array system of the invention possesses the intrinsic capability of producing a protective diode 9 simultaneously with the solar cell 8 on the same carrier substrate. (See FIG. 5.) Protective diodes have the principle purpose of bridging possible malfunctions or protecting against damage from currents flowing from the external circuit in the cut-off direction. This occurs in partly shaded modules of multiple solar cells. Therefore, protective diodes are placed in parallel in relation to the solar cell in the modules.

The layer solar cell array system of the invention permits combining the solar cell 8 and the protective diode 9 in one component. For this purpose, an insulation groove 10 perpendicular to the contact electrodes 3a and 3b through the active solar cell layer 1 down to the insulation layer 5 is required. The insulation groove 10 can be etched, produced by laser, sawed or produced in another manner and divides the active solar cell into a zone that acts as a solar cell 8 and a zone that serves as the protective diode 9.

Otherwise, joint production of the solar cell and the protective diode occurs as previously described. However, the emitter layer 1a of the protective diode 9 is connected via the corresponding contact channels 6a with the positive-contact electrodes 3b, the base layer 1b with the negative-contact electrodes 3a. In this manner, the required parallel connection of the protective diode 9 and the solar cell 8 is automatically realized with reverse polarity.

For simpler connection in the module or external circuit, the contact electrodes 3a and 3b contacting the emitter respectively the base of the solar cell can be connected at the end of the component by a transverse running strip conductor 31a, 31b as a so-called bus. Instead of contacting each grid finger of the contact electrodes individually with the external circuit, it suffices if each respective contacts the transverse positive-contact bus 31b negative-contact bus 31a. For this purpose, a part of the respective bus is bared, i.e. the solar cell layer and the insulation layer are removed at certain locations.

Figure 6:
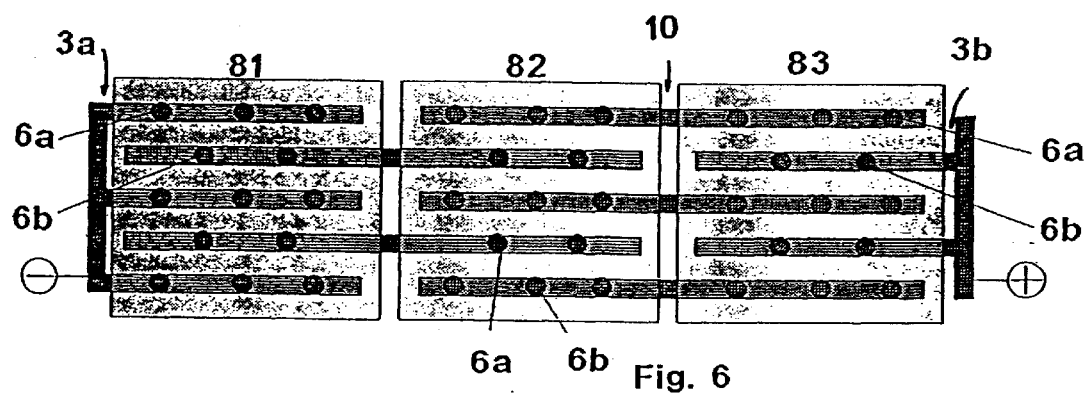
FIG. 6 illustrates modular interconnection of multiple thin-layer solar cell array systems.

Furthermore, based on the thin-layer solar cell array system of the invention, a module of multiple solar cells 81, 82 and 83 can be realized in a simple manner on a monolithic substrate. The interconnection of the solar cells is an intrinsic part of the structure. The production of the module is analogous to the aforedescribed production of a single solar cell. The active solar cell layer 1 is either deposited only in the separated zones corresponding to the individual solar cells, or a homogenous layer is subdivided in corresponding zones by separating grooves 10, which reach down to the insulation layer 5. (See FIGS. 6 and 7.) The subdivision occurs along the contact electrodes, i.e. the individual solar cells are separated perpendicular to the contact electrodes. Two aspects ensure serial connection of all solar cells 81, 82, and 83. First, the contact electrodes are not applied on every cell, but rather are applied in such a manner that successive solar cells always only use one type of the two types of contact electrodes jointly (FIG. 6). Secondly, the emitter layers of successive solar cells are alternately connected with the opposite polarity contact electrode. For example, if the emitter of the cell 81 is connected with the positive-contact electrodes, cell 82 is connected with the negative-contact electrodes, cell 83 again with the positive-contact electrodes, etc. Correspondingly, the bases of the successive solar cells are contacted alternately with the minus-contact electrodes and the plus contact electrodes. This is realized in that the emitter contact holes 6a of successive solar cells are alternately produced above the negative-contact electrodes and the positive-contact electrodes. The same applies to the base contact holes 6b. As all of the emitter contact holes 6a and base contact holes 6b can be produced simultaneously for all the solar cells, apart from the separating grooves, no additional process step is required to fabricate a whole module instead of a single solar cell.

Figure 7:
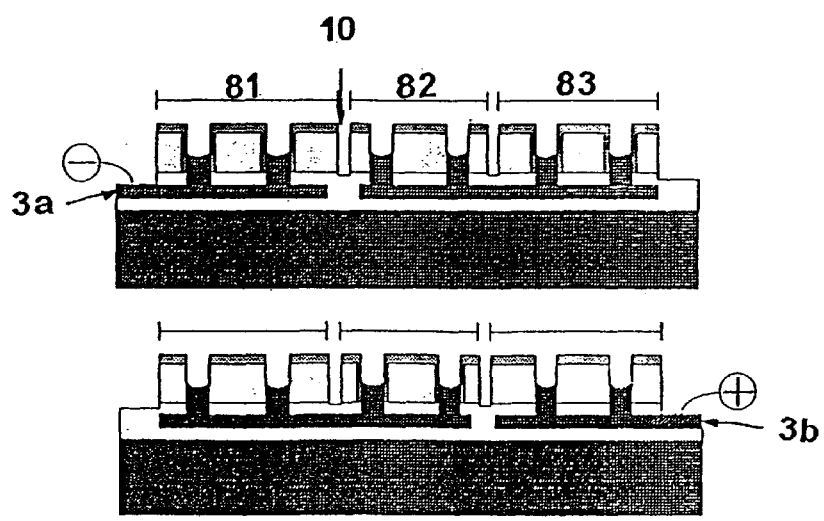
FIG. 7 illustrates a cross section of an array system according to FIG. 6.

FIG. 7 shows two longitudinal sections of such a module along a negative-contact electrode 3a and a positive-contact electrode 3b. Alternately, emitter 1a and base 1b of successive solar cells are contacted along one contact electrode and are connected by the contact electrodes. In this case only two successive cells are connected by one polarity of contact electrode. This is a serial connection of all the solar cells on the monolithic module. Soldering or wiring the individual cells is obviated.

As described in the preceding, the present invention also permits integrating a protective diode for each solar cell in such a module during production. In this manner an electrically protected monolithic voltage source is obtained whose voltage can be adapted to the user's requirements via the number of solar cells.

List of Reference Numbers

1 active solar cell layer
1a emitter layer, semiconductor layer zone of a doping type
1b base layer, semiconductor layer zone of the other doping type
2 carrier substrate
3a contact electrode, negative contact electrode
3b contact electrode, positive contact electrode
31a and 31b bus contact electrode
4 insulation layer
5 insulation layer
6a contact channel, emitter contact channel
6b contact channel, base contact channel
7 conductive material, for example metal
8 solar cell
81, 82 and 83 solar cells connected in parallel
9 protective diode
10 insulation groove

What is claimed is:

1. A thin-layer solar cell array system including a solar cell layer placed over a planar substrate and provided with at least one n-type semiconductor zone and at least one p-type semiconductor zone, first and a second contact electrodes respectively of different electrical polarity and respectively connected to the n-type semiconductor zone and to the p-type semiconductor zone wherein:

an electrical insulation layer is disposed on the planar substrate on which the first and second contact electrodes are disposed;

the first contact electrode faces and is under the solar cell layer;

the solar cell layer is separated from the first and second contact electrodes;

at least one first contact channel extends at least through the solar cell layer so that the first contact electrode and the n-type semiconductor zone are electrically connected by an electrically conductive material inside the at least one first contact channel;

the second electrical contact electrode faces and is under the solar cell layer and is spaced from and electrically insulated from the first contact electrode; and at least one second contact channel extends at least through the solar cell layer so that the second contact electrode and the at least one p-type semiconductor zone are electrically connected by an electrically conductive material inside the at least one second contact channel.

2. The thin-layer solar cell array system according to claim 1 comprising:

an additional insulation layer disposed on top of the insulation layer which separates the first and second contact electrodes from the solar cell layer; and the at least one first and second contact channels also extend through the additional insulation layer.

3. The thin-layer solar cell array system according to claim 1, wherein:

the n-type conducting semiconductor zone and the p-type semiconductor zone are planar layers disposed on top of each other.

4. The thin-layer solar cell array system according to claim 2, wherein:
the n-type conducting semiconductor zone and the p-type semiconductor zone are planar layers disposed on top of each other.

5. The thin-layer solar cell array system according to claim 1, wherein:
the first and second contact electrodes are intermeshed and spaced apart strip conductors, are placed above the carrier substrate.

6. The thin-layer solar cell array system according to claim 2, wherein:
the first and second contact electrodes are intermeshed and spaced apart strip conductors, are placed above the carrier substrate and are under the additional electrical insulating layer and the solar cell layer.

7. The thin-layer solar cell array system according to claim 3, wherein:
the first and second contact electrodes are intermeshed and spaced apart strip conductors, are placed above the carrier substrate.

8. The thin-layer solar cell array system according to claim 4, wherein:
the first and second contact electrodes are intermeshed and spaced apart strip conductors, are placed above the carrier substrate and are under the additional electrical insulating layer and the solar cell layer.

9. The thin-layer solar cell array system according to claim 1, wherein:
the at least one first and second contact channels are blind holes extending through the solar cell layer and border one of the contact electrodes.

10. The thin-layer solar cell array system according to claim 2, wherein:
the at least one first and second contact channels are blind holes extending through the solar cell layer and the additional insulation layer and border one of the contact electrodes.

11. The thin-layer solar cell array system according to claim 3, wherein:
the at least one first and second contact channels are blind holes extending through the solar cell layer and border one of the contact electrodes.

12. The thin-layer solar cell array system according to claim 2, wherein:
the at least one first contact channel is lined down to the additional insulation material with an n-type semiconductor lining material and the electrical conducting material connects the first contact electrode electrically with the n-type semiconductor lining material and the at least one second contact channel is lined down to the additional insulation layer with a p-type semiconductor lining material and the electrically conducting material connects the second contact electrode electrically with the p-type semiconductor lining material.

13. The thin-layer solar cell array system according to claim 3, wherein:
the at least one first contact channel is lined down to the additional insulation material with an n-type semiconductor lining material and the electrical conducting material connects the first contact electrode electrically with the n-type semiconductor lining material and with a p-type semiconductor lining material and the electrically conducting material connects the second contact electrode electrically with the p-type semiconductor lining material.

14. The thin-layer solar cell array system according to claim 4, wherein:
the at least one first contact channel is lined down to the additional insulation material with an n-type semiconductor lining material and the electrical conducting material connects the first contact electrode electrically with the n-type semiconductor lining material and the at least one second contact channel is lined down to the additional insulation layer with a p-type semiconductor lining material and the electrically conducting material connects the second contact electrode electrically with the p-type semiconductor lining material.

15. The thin-layer solar cell array system according to claim 5, wherein:
the at least one first contact channel is lined down to the additional insulation material with an n-type semiconductor lining material and the electrical conducting material connects the first contact electrode electrically with the n-type semiconductor lining material with a p-type semiconductor lining material and the electrically conducting material connects the second contact electrode electrically with the p-type semiconductor lining material.

16. The thin-layer solar cell array system according to claim 6, wherein:
the at least one first contact channel is lined down to the additional insulation material with an n-type semiconductor lining material and the electrical conducting material connects the first contact electrode electrically with the n-type semiconductor lining material and the at least one second contact channel is lined down to the additional insulation layer with a p-type semiconductor lining material and the electrically conducting material connects the second contact electrode electrically with the p-type semiconductor lining material.

17. The thin-layer solar cell array system according to claim 7, wherein:
the at least one first contact channel is lined down to the additional insulation material with an n-type semiconductor lining material and the electrical conducting material connects the first contact electrode electrically with the n-type semiconductor lining material and with a p-type semiconductor lining material and the electrically conducting material connects the second contact electrode electrically with the p-type semiconductor lining material.

18. The thin-layer solar cell array system according to claim 9, wherein:
the at least one first and second contact channels are provided with an interior contour shaped as one of a straight cylinder or a truncated cone.

19. The thin-layer solar cell array system according to claim 10, wherein:
the at least one first and second contact channels are provided with an interior contour shaped as one of a straight cylinder or a truncated cone.

20. The thin-layer solar cell array system according to claim 11, wherein:
the at least one first and second contact channels are provided with an interior contour shaped as one of a straight cylinder or a truncated cone.

21. The thin-layer solar cell array system according to claim 1, comprising:

a protective diode is provided which is one of laterally separated or electrically insulated from the solar cell layer on the carrier substrate, the protective diode structure including the n-type and p-type semiconductor zones electrically contacting the first and second contact electrodes so that contacting the semiconductor zones occurs with a reverse polarity in comparison to an adjacent solar cell layer.

22. The thin-layer solar cell array system according to claim 21, wherein:

the n-type semiconductor zone is connected with the contact electrode of positive polarity and the p-type semiconductor zone is connected with the contact electrode of negative polarity.

\* \* \* \* \*